(12) United States Patent
Ishizaki et al.

(10) Patent No.: US 11,178,760 B2
(45) Date of Patent: Nov. 16, 2021

(54) PRINTED CIRCUIT BOARD

(71) Applicants: Kabushiki Kaisha Toshiba, Tokyo (JP); Toshiba Electronic Devices & Storage Corporation, Tokyo (JP)

(72) Inventors: Kiyokazu Ishizaki, Tokyo (JP); Nobuhiro Yamamoto, Yokohama Kanagawa (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 0 days.

(21) Appl. No.: 16/784,301

(22) Filed: Feb. 7, 2020

(65) Prior Publication Data
US 2021/0084760 A1    Mar. 18, 2021

(30) Foreign Application Priority Data
Sep. 17, 2019  (JP) .............................. JP2019-168609

(51) Int. Cl.
*H05K 1/11* (2006.01)
*H05K 1/18* (2006.01)
*G11B 5/82* (2006.01)

(52) U.S. Cl.
CPC ................ *H05K 1/111* (2013.01); *G11B 5/82* (2013.01); *H05K 1/181* (2013.01);
(Continued)

(58) Field of Classification Search
CPC . H05K 1/11; H05K 1/111; H05K 1/18; H05K 1/181–187; H05K 3/284; H05K 3/3442; H05K 3/3421
(Continued)

(56) References Cited

U.S. PATENT DOCUMENTS 4,883,920 A * 11/1989 Tanabe ................. H05K 3/3442
174/263
5,453,581 A * 9/1995 Liebman ................ H05K 1/111
174/261
(Continued)

FOREIGN PATENT DOCUMENTS

JP    H8-46337 A    2/1996
JP    2568816 B2    1/1997
(Continued)

*Primary Examiner* — Tuan T Dinh
(74) *Attorney, Agent, or Firm* — Allen & Overy, LLP

(57) ABSTRACT

According to one embodiment, a printed circuit board includes a base substrate, a first pad located on the base substrate, a second pad located on the base substrate alongside the first pad with respect to a first direction X with a gap therebetween and a solder resist covering the base substrate and including a cavity portion in a position overlapping the first pad and the second pad, the solder resist including a first protruding portion projecting in a second direction crossing the first direction and a second protruding portion projecting in the second direction on an opposite side to the first protruding portion, and the first protruding portion and the second protruding portion each overlap the gap, an end of the first pad on a gap side, and an end of the second pad on a gap side.

10 Claims, 12 Drawing Sheets

(52) U.S. Cl.
CPC .............. *H05K 2201/09381* (2013.01); *H05K 2201/10015* (2013.01); *H05K 2201/10159* (2013.01)

(58) Field of Classification Search
USPC .......... 361/760–767, 772–774; 174/258–262
See application file for complete search history.

(56) References Cited

U.S. PATENT DOCUMENTS

| | | | | |
|---|---|---|---|---|
| 6,169,253 | B1* | 1/2001 | Jairazbhoy | H05K 3/3442 174/250 |
| 7,045,902 | B2* | 5/2006 | Liu | H05K 1/111 257/780 |
| 7,465,885 | B2* | 12/2008 | Chi | H05K 3/284 174/260 |
| 7,916,495 | B2* | 3/2011 | Huang | H05K 3/3442 361/767 |
| 7,967,184 | B2* | 6/2011 | Liao | H05K 3/3442 228/180.21 |
| 2003/0184986 | A1* | 10/2003 | Soga | H05K 3/3442 361/767 |
| 2009/0185096 | A1* | 7/2009 | Park | H05K 3/3421 349/56 |
| 2012/0014078 | A1* | 1/2012 | Watanabe | H05K 7/1061 361/760 |
| 2016/0073504 | A1* | 3/2016 | Hiraoka | H05K 1/181 361/767 |

FOREIGN PATENT DOCUMENTS

| | | |
|---|---|---|
| JP | 2001-308503 A | 11/2001 |
| JP | 2006-303252 A | 11/2006 |
| JP | 2008-123722 A | 5/2008 |
| JP | 2010-165812 A | 7/2010 |
| JP | 4852111 B2 | 1/2012 |
| JP | 2012-64720 A | 3/2012 |

* cited by examiner

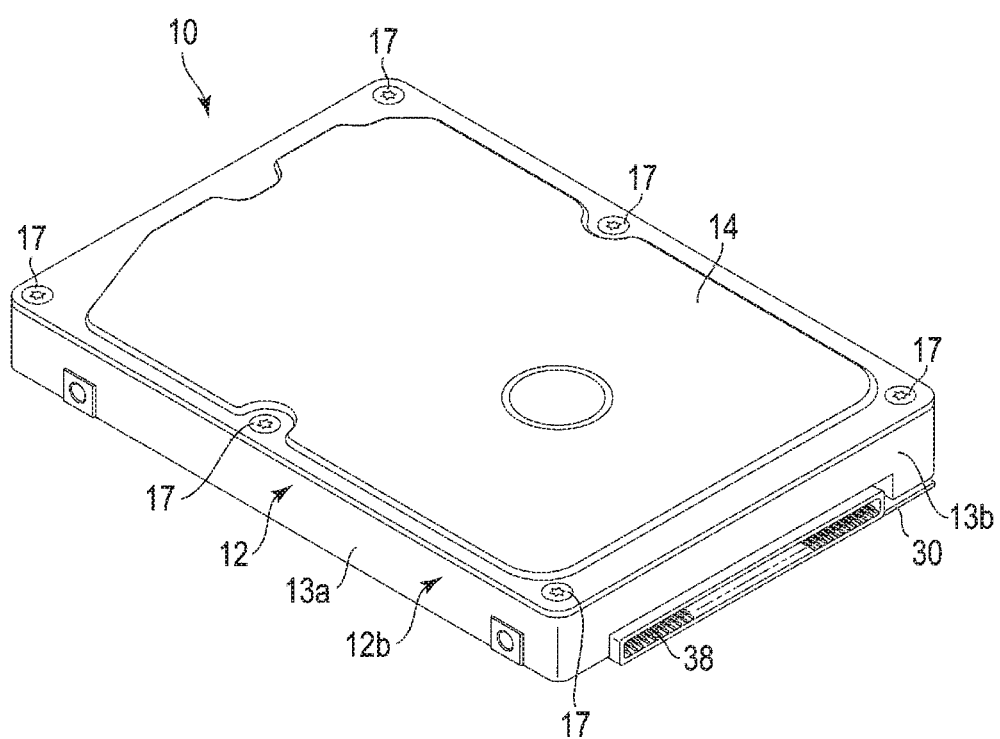
F I G. 1

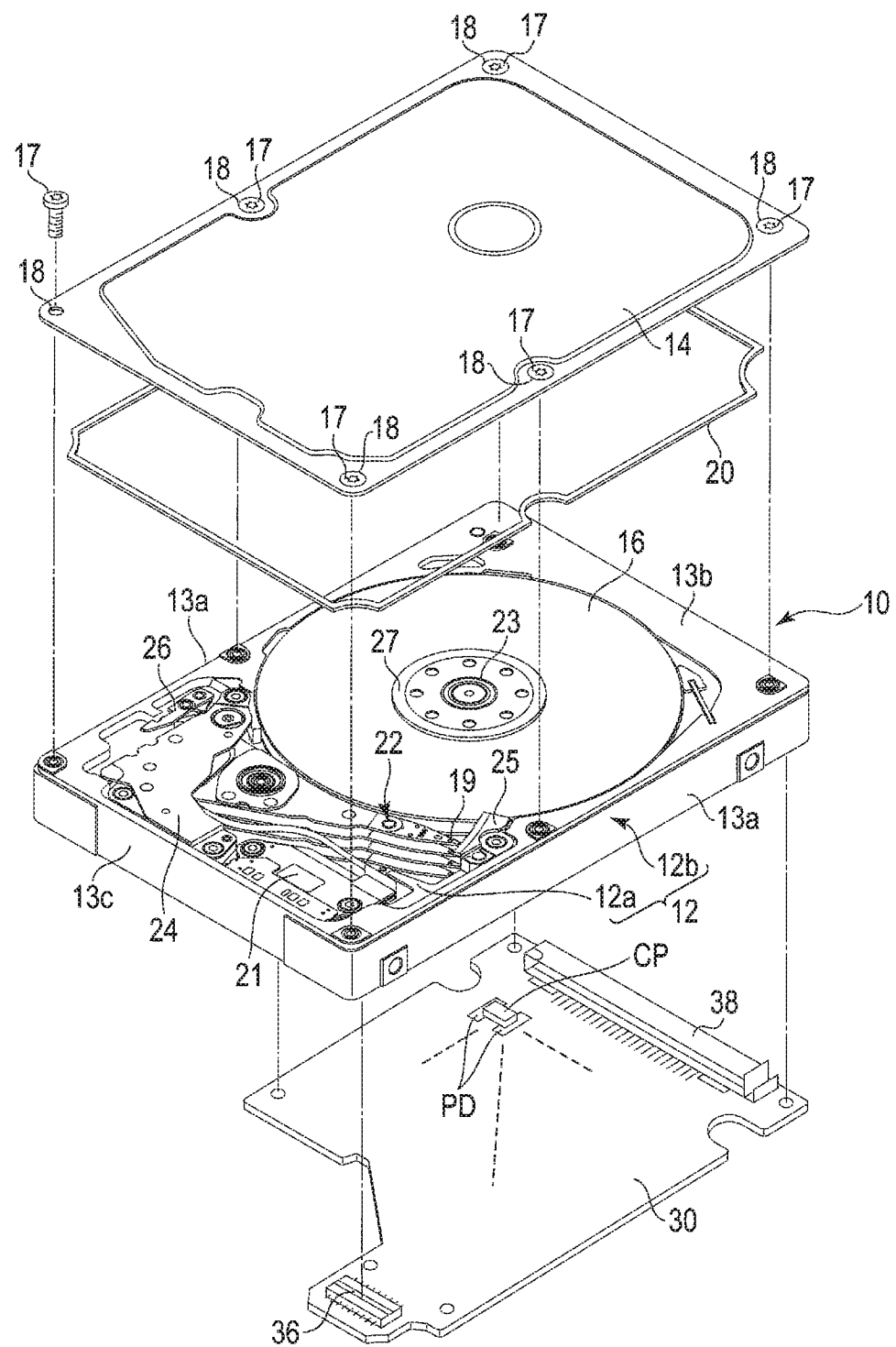
F I G. 2

PRINTED CIRCUIT BOARD

CROSS-REFERENCE TO RELATED APPLICATIONS

This application is based upon and claims the benefit of priority from Japanese Patent Application No. 2019-168609, filed Sep. 17, 2019, the entire contents of which are incorporated herein by reference.

FIELD

Embodiments described herein relate generally to a printed circuit board.

BACKGROUND

As the demand of the printed circuit boards for smart phones or in-vehicle electronic devices expands, the demand of chip parts of resistors and capacitors is increasing. As the types of the products diversify, various sizes of chip parts are produced, by, which many types of wiring patters of printed circuit boards are now required. However, there has been a drawback in which the wiring pattern of a printed circuit board containing a complicatedly designed circuit therein cannot be easily or quickly changed. A further drawback is that if the design of a printed circuit board is greatly changed, the cost arises significantly. Moreover, in such a situation where substitutes of chip parts must be supplied due to shortage of the chip in stock, etc., a part of the printed circuit board cannot be promptly modified, thereby causing its production line to stop. In order to solve these drawbacks, there has been proposed an electrode structure for soldering which can use substituting chip parts without changing the wiring pattern of the printed circuit board. In such electrode structure for soldering, a plurality of sizes of chip parts can be used. In the meantime, there are various soldering technologies proposed in consideration of displacement of chip parts due to the surface tension of molten solder while soldering the chip part to an electrode.

BRIEF DESCRIPTION OF THE DRAWINGS

FIG. 1 is a perspective view showing an HDD.

FIG. 2 is an exploded perspective view showing the HDD when decomposed.

DETAILED DESCRIPTION

Figure 3:
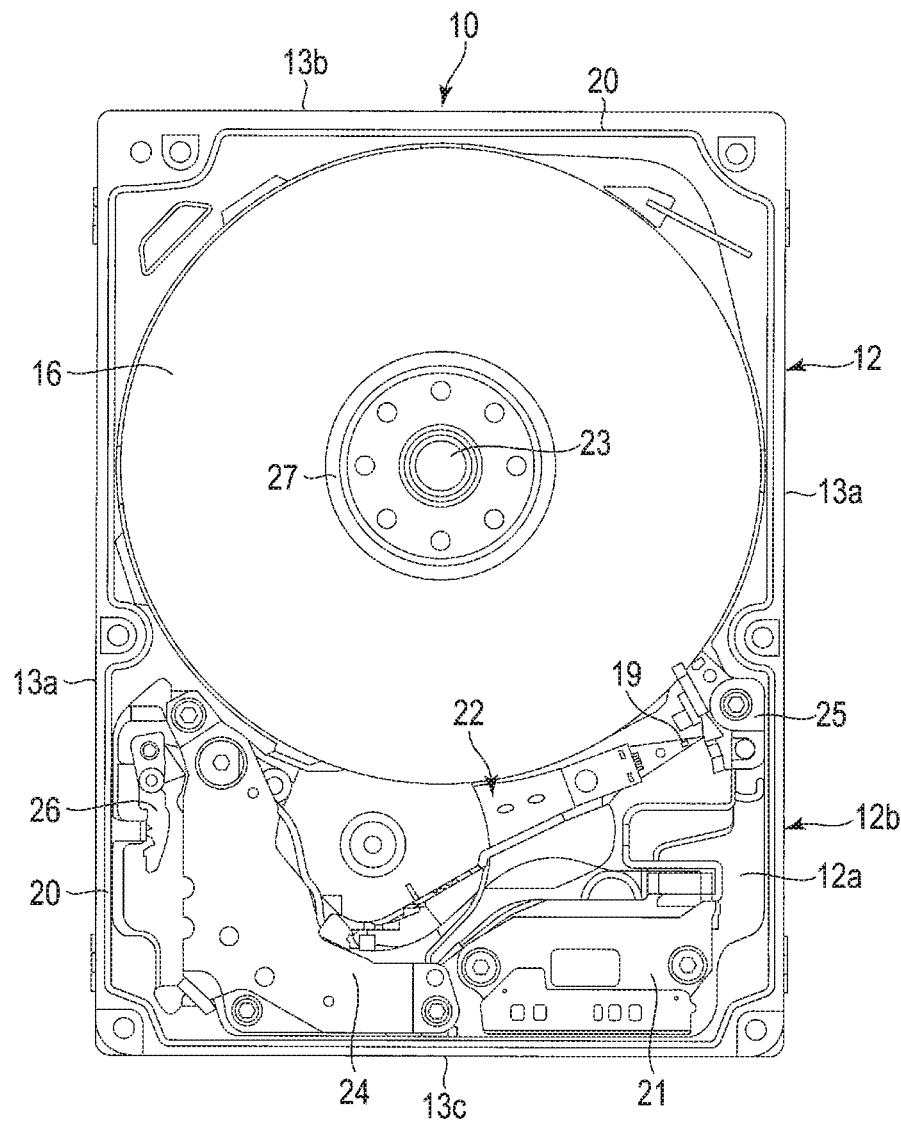
FIG. 3 is a plan view showing an internal structure of the HDD.

In general, according to one embodiment, a printed circuit board comprises a base substrate, a first pad located on the base substrate, a second pad located on the base substrate alongside the first pad with respect to a first direction with a gap therebetween and a solder resist covering the base substrate and including a cavity portion in a position overlapping the first pad and the second pad, the solder resist including a first protruding portion projecting in a second direction crossing the first direction and a second protruding portion projecting in the second direction on an opposite side to the first protruding portion, and the first protruding portion and the second protruding portion each overlap the gap, an end of the first pad on a gap side, and an end of the second pad on a gap side.

Hereafter, some embodiments will be described with reference to the drawings. What is disclosed in this specification is merely an example. Appropriate modifications which can be easily conceived by a person ordinarily skilled in the art without departing from the spirit of the embodiments naturally fall within the scope of the present invention. To further clarify explanation, for example, the width, thickness or shape of each structure may be schematically shown in the drawings as compared with the actual forms. Note that the drawings are merely examples and do not limit the interpretation of the present embodiments. Moreover, in this specification and each drawing, the same referential mark may be given to the component which exhibits the function which was the same as or similar to that of what was mentioned above about the drawing of existing appearance, and the overlapping detailed explanation may be omitted suitably.

The structures of the printed circuit boards illustrated in this specification are applicable to the printed circuit boards used for various electronic devices. In this specification, printed circuit boards used for hard disk drives (HDD) will be described as examples of the embodiments.

First Embodiment

FIG. 1 is a perspective view showing an HDD. FIG. 2 is an exploded perspective view showing the HDD when decomposed. FIG. 3 is a plan view showing an internal structure of the HDD.

As shown in FIGS. 1 to 3, the HDD comprises a housing 10. The housing 10 includes a rectangular box-shaped base 12 whose upper surface is opened, and a rectangular plate-shaped top cover 14. The top cover 14 is secured to the base 12 with a plurality of screws 17 and closes the upper opening of the base 12. The base 12 includes a rectangular bottom wall 12a, and side walls 12b formed to stand upright along a circumference of the bottom wall, which are formed integrally into on body from a metal material such as aluminum or stainless steel. The side walls 12b of the base 12 include a pair of long side walls 13a opposing each other, and a first short side wall 13b and a second short side wall 13c opposing each other.

The top cover 14 is formed into a rectangular plate with dimensions substantially equal to those of the bottom wall 12a of the base 12 by, for example, press-molding a stainless plate. In four corner portions of the top cover 14, and in substantially center of the pair of long-side edges, through holes 18 are respectively formed. The top cover 14 is fastened. to the side walls 12b of the base 12 by screwing screws 17 put through the respective through holes 18 into screw holes formed in the side walls 12b of the base 12. In other words, the top cover 14 is fixed to the base 12 with the screws 17 by both longitudinal ends of the first short side wall 13b, both longitudinal ends of the second short side wall 13c, and substantially longitudinal central portion of each long side wall 13.

A frame-like packing (gasket) 20 is interposed between the upper end surface of the side walls 12b of the base 12, and the outer circumferential portion of the top cover 14. With the packing 20, the base 12 and the top cover 14 are airtightly sealed together.

As shown in FIGS. 2 and 3, the housing 10 accommodates therein a plurality of, for example, three magnetic disks 16 as recording media, and a spindle iii motor 23 as a drive unit which supports and rotates the magnetic disks 16. The spindle motor 20 is provided on the bottom wall 12a. The magnetic disks 16 are formed to have a diameter of, for example, 88.9 mm (3.5 inches) and include magnetic recording layers (magnetic recording surfaces) respectively on one surface (upper surface) and the other surface (lower surface). The magnetic disks 16 are fit coaxially with a hub (not shown) of the spindle motor 23, clamped by a clamp spring 27, and thereby fixed to the hub. With this structure, the magnetic disks 16 are supported parallel to the bottom wall 12a of the base 12. The magnetic disks 16 are rotated at predetermined speed by the spindle motor 23. Moreover, in the housing 10, the magnetic disks 16 are disposed to drift towards a first short side wall 13b side with respect to the longitudinal center of the base 12. Thus, the magnetic disks 16 are located adjacent to the first short side wall 13b but apart from the second short side wall 13c.

In the housing 10, a plurality of magnetic heads 19 which read and write data with respect to the magnetic disks 16, and a carriage assembly 22 movably supports the magnetic heads 19 with relative to the magnetic disks 16. Moreover, the housing 10 accommodates a voice coil motor (to be referred to as VCM hereinafter) 24 which pivots and positions the carriage assembly 22, a ramp load mechanism 25 which holds the magnetic heads 19 in unloading positions apart from the magnetic disks 16 when the magnetic heads 19 move to the outermost circumference of the magnetic disks 16, a latch mechanism 26 which holds the carriage assembly 22 in a retreat position when a shock or the like is applied on the HDD, and a flexible printed circuit substrate (FPC) unit 21 in which electronic parts such as conversion connectors are mounted. The carriage assembly 22, the VCM 24, the ramp load mechanism 25, the latch mechanism 26, and the FPC unit 21 are arranged in a space between the magnetic disks 16 and the second short side wall 13c in the base 12.

As shown in FIGS. 1 and 2, the HDD includes a printed circuit board 30. The printed circuit board 30 is secured to an external surface (bottom surface) of the bottom wall 12a of the base 12 with a plurality of screws, so as to oppose the bottom wall 12a of the base 12 with a slight gap therebetween. Between an outer surface of the bottom wall 12a of the base 12 and the printed circuit board 30, an insulation sheet (or insulation film) (not shown) is disposed as an insulating member.

A plurality of pads PD and chip parts CP are provided on an inner surface (, which is on a side opposing the base 12) of the printed circuit board 30. One chip CP is mounted on a pair of pads PD. The chip parts CP are, for example, capacitors and the like. On the inner surface of the printed circuit board 30, a plurality of semiconductor devices and semiconductor chips which constitute controllers, and electronic parts including a rotation vibration sensor (or acceleration sensor), and connection terminals for the spindle motor 23, and the like may be provided. A connector 36 is provided on one longitudinal one side of the printed circuit board 30, and an interface connector 38 connectable to an external device is mounted in the other longitudinal end side of the printed circuit board 30.

In a state where the printed circuit board 30 is attached to the base 12, the connector 36 is connected to the conversion connector mounted in the FPC unit 21. The interface connector 38 is located near the first short side wall 13b of the housing 10. A rectangular recess is formed in, for example, a bottom wall 12a side of the first short side wall 13b, and the interface connector 38 is disposed in this recess. The controller of the printed circuit board 30 controls the operation of the spindle motor 23 and controls the operation of the VCM 24 and the magnetic heads 19 via. the FPC unit 21.

Figure 4:
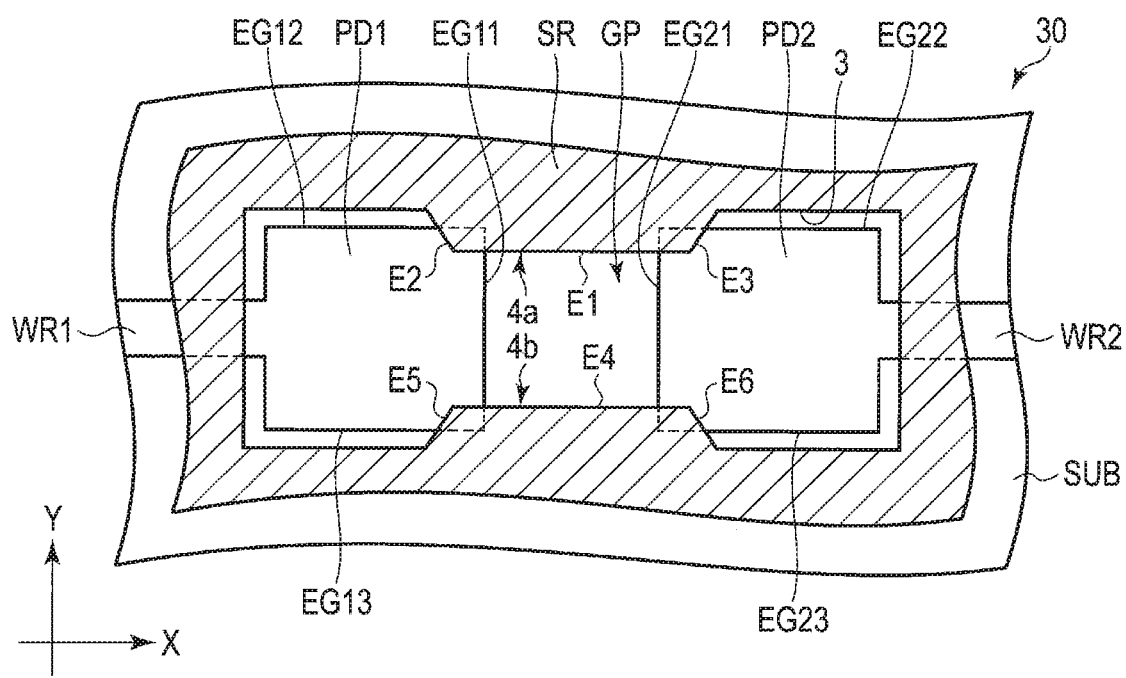
FIG. 4 is a partially expanded plan view showing a printed circuit board of the first embodiment.

FIG. 4 is a partially expanded plan view showing the printed circuit board 30 of the first embodiment. FIG. 4 illustrates a state where chip parts CP are not mounted in the printed circuit board 30. For example, a first direction X and a second direction Y are normal to each other, but they may cross at an angle other than 90 degrees.

The printed circuit board 30 comprises a base substrate SUB, a first pad PD1 and a second pad PD2, located on the base substrate SUB and a solder resist SR which covers the base substrate SUB. The second pad PD2 is located alongside the first pad PD1 in the first direction X with a gap GP therebetween. The first pad PD1 is connected to a wiring line WR1. The second pad PD2 is connected to a wiring line WR2. The solder resist SR includes a cavity portion 3 in a position overlapping the first pad PD1 and the second pad PD2. The solder resist SR is not formed in the gap GP between the first pad PD1 and the second pad PD2.

The solder resist SR includes a first protruding portion 4a projecting in the second direction Y, and a second protruding portion 4b projecting in the second direction Y in an opposite side to the first protruding portion 4a. The first protruding portion 4a and the second protruding portion 4b each overlap the gap GP, an edge portion EG11 on a gap GP side of the first pad PD1 and an edge portion EG21 on a gap GP side of the second pad PD2. The first protruding portion 4a includes a first edge E1, a second edge E2, and a third edge E3. The first edge E1 extends out in the first direction X. The second edge E2 extends from one end of the first edge E1 along the first direction X, passes through an edge portion EG12 of the first pad PD1 out over the first pad PD1, is inclined with respect to the first direction X. The third edge E3 extends from the other end of the first edge E1 along the first direction X, passes through an edge portion EG22 of the second pad PD2 out over the second pad PD2, and is inclined with respect to the first direction X. The second protruding portion 4b includes a fourth edge E4, a fifth edge E5 and a sixth edge E6. The fourth edge E4 extends in the first direction X and opposes the first edge E1 with a gap therebetween. The fifth edge E5 extends from an end of the fourth edge E4 along the first direction X, passes through an edge portion EG13 of the first pad PD1 out over the first pad PD1, and is inclined with respect to the first direction X. The sixth edge E6 extends from the other end of the fourth edge E4 along the first direction X, passes through the edge portion EG23 of the second pad PD2 out over the second pad PD2, and is inclined with respect to the first direction X.

Figure 5:
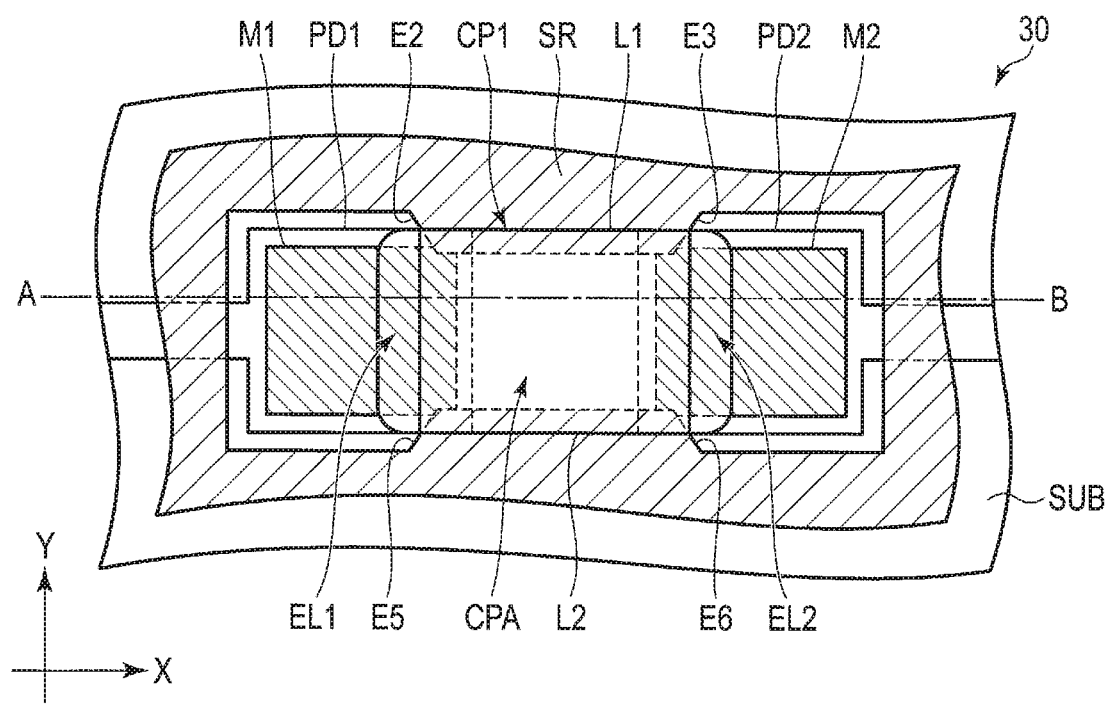
FIG. 5 is a plan view showing a state where a chip part is mounted in a first pad and a second pad shown in FIG. 4.
Figure 6:
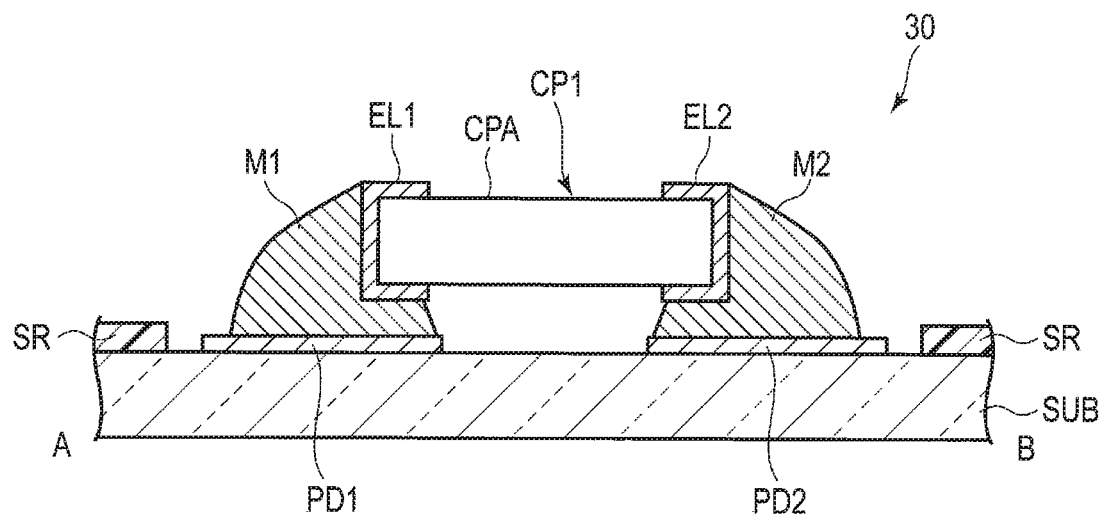
FIG. 6 is a cross section of the printed circuit board taken along line A-B shown in FIG. 5.

FIG. 5 is a plan view showing a state where a chip part CP1 is mounted on the first pad PD1 and the second pad PD2 shown in FIG. 4. As compared with the structure shown in FIG. 4, the printed circuit board 30 shown in FIG. 5 further comprises a metal layer (first metal layer) M1, a metal layer (second metal layer) M2 and the chip part CP1. Moreover, FIG. 6 is a cross section of the printed circuit board 30 taken along line A-B shown in FIG. 5.

The chip part CP1 comprises a main body CPA, a first electrode EL1 located on one end side of the main body CPA, and a second electrode EL2 located on the other end side of the main body CPA. For example, the chip part CP1 has a width along the first direction X of about 0.6 mm, and a width along the second direction Y of about 0.3 mm. As shown in FIG. 6, the metal layer M1 was located on the first pad PD1 and is in contact with the first electrode EL1. Further, the metal layer M2 is located on the second pad PD2 and is in contact with the second electrode EL2. The first electrode EL1 of the chip part CP1 is electrically connected to the first pad PD1 via the metal layer M1. The second electrode EL2 of the chip part CP1 is electrically connected to the second pad PD2 via the metal layer M2. The chip part CP1 comprises a first long side L1 and a second long side L2, each extending along the first direction X. The first long side L1 intersects the second edge E2 and the third edge E3 in plan view. The second long side L2 intersects the fifth edge E5 and the sixth edge E6 in plan view.

The metal layers M1 and M2 are prepared by melting a solder paste and solidifying it thereafter. The solder paste is a mixture of solder particles and flux. The solder paste is printed on, for example, a pad PD using a mask with a hole formed therein. The solder paste may be printed on the entire pad PD, or in a size greater than that of the pad PD, or at an area ratio of about 80% with respect to the pad PD. The chip parts CP are placed on the printed solder paste. In the state where the chip parts CP are placed on the solder paste, the printed circuit board 30 is heated, and thus the solder particles melt and join together and the flux is evaporated. Here, the material obtained by heating the solder particles to melt and liquefy is called molten solder. As the printed circuit board 30 is cooled down, the molten solder solidifies, thus forming the metal layers M1 and M2. The metal layers M1 and M2 fix the chip parts CP to the pads PD and connect thereto. The metal layers M1 and M2 are in contact with the first protruding portion 4a and the second protruding portion 4b.

The molten solder is stopped by the solder resist SR. That is, the molten solder flows along an edge of the solder resist SR. The chip parts CP float on the molten solder by surface tension. Thus, when the molten solder is cooled to solidify, the chip parts CP move along with the movement of the molten solder. Here, by controlling the flow of the molten solder, the chip parts CP can be positioned. The molten solder has high viscosity and high surface tension, and therefore it can draw the chip parts CP to stable positions.

According to this embodiment, the solder resist SR includes the first protruding portion 4a and the second protruding portion 4b. With this structure, the molten solder is stopped by the first protruding portion 4a and the second protruding portion 4b, to suppress positioning error of the chip part CP1. Thus, a connection error, which may be caused by positioning error of the chip CP1 can be suppressed. Further, in the example illustrated, the second edge E2 and the third edge E3 of the first protruding portion 4a are inclined and the fifth edge E5 and the sixth edge E6 of the second protruding portion 4b are inclined. With this structure, the molten solder can be stopped in the first direction X and the second direction Y, and by controlling the inclined angles of the second edge E2, the third edge E3, the fifth edge E5 and the sixth edge E6 and the projection widths of the first protruding portion 4a and the second protruding portion 4b, the positioning of the chip part CP1 can be adjusted.

Figure 7:
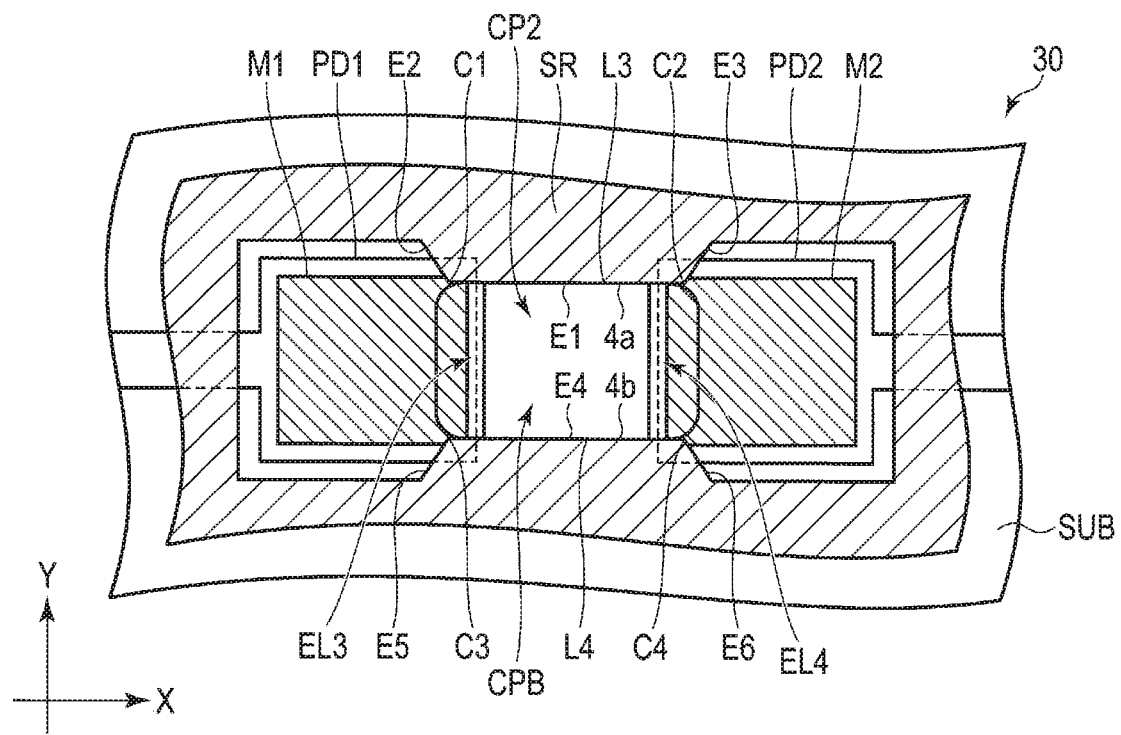
FIG. 7 is a plan view showing a state where a chip part is mounted in the first pad and the second pad shown in FIG. 4.

FIG. 7 is a plan view showing a state where a chip part CP2 is mounted on the first pad PD1 and the second pad PD2 shown in FIG. 4. The printed circuit board 30 shown in FIG. 7 further comprises metal layers M1 and M2 and the chip part CP2 as compared with the structure shown in FIG. 4.

The chip part CP2 comprises a main body CPB, a third electrode EL3 located on one coo side of the main body CPB and a fourth electrode EL4 located on the other end side of the main body CPB. The chip part CP2 has, for example, a width along the first direction X of is about 0.4 mm and a width along the second direction Y of about 0.2 mm. The third electrode EL3 of the chip part CP2 is electrically connected to the first pad PD1 via the metal layer M1. The fourth electrode EL4 of the chip part CP2 is electrically connected to the second pad PD2 via the metal layer M2. The chip part CP2 comprises a third long side L3 and a fourth long side L4, extending in the first direction X. The third long side L3 has overlaps the first edge E1 of the first protruding portion 4a. The fourth long side L4 overlaps the fourth edge E4 of the second protruding portion 4b. The chip part CP2 comprises corner portions C1, C2, C3 and C4. The corner portion C1 overlaps a corner portion of the first protruding portion 4a where the first edge E1 and the second edge E2 intersect each other. The corner portion C2 overlaps a corner portion of the first protruding portion 4a where the first edge E1 and the third edge E3 intersect each other. The corner portion C3 overlaps a corner portion of the second protruding portion 4b where the fourth edge E4 and the fifth edge E5 intersect each other. The corner portion C4 overlaps a corner portion of the second protruding portion 4b where the fourth edge E4 and the sixth edge E6 intersect each other.

According to this embodiment, the solder resist SR includes the first protruding portion 4a and the second protruding portion 4b. Therefore, the width of the cavity portion 3 along the second direction Y is narrowed between the first protruding portion 4a and the second protruding portion 4b. Therefore, the molten solder is stopped by the first edge E1 and the fourth edge E4, and thus positioning error, which may be caused by rotation of the chip part CP2, can be suppressed. Further, connection error, which may be caused by positioning error of the chip part CP2, can be suppressed.

As shown in FIG. 6, in the chip part CP1, the second edge E2, the third edge E3, the fifth edge E5, and the sixth edge E6, which are inclined, contribute to positioning. Moreover, as shown in FIG. 7, in the chip part CP2, the first edge E1 and the fourth edge E4, which extend in the first direction X, contribute to positioning. Thus, by forming the first protruding portion 4a and the second protruding portion 4b, the chip parts CP1 and CP2, which differ from each other in size, can be positioned.

According to this embodiment, as shown in FIGS. 6 and 7, the chip parts CP1 and CP2 which differ in size can be mounted commonly in the first pad PD1 and the second pad PD2. Therefore, even if one of chip paths CP1 and CP2 is in shortage in stock, another chip can be used in place. Here, even if the chip part CP1 or CP2, which differs in size, is mounted in the same position, mounting error of chip parts or defect in soldering can be suppressed because the form of the solder resist SR corresponds to both sizes. Moreover, it is not necessary to change the printed circuit board 30 greatly according to a change in size of the chip part, and it suffices if only the solder resist SR is changed. Moreover, the size of the chip parts to be mounted can be changed without changing the size of the first pad PD1 or the second pad PD2. Note that the sizes of the first pad PD1 and the second pad PD2 are set based on the chip parts of the maximum size which may be mounted on the first pad PD1 and the second pad PD2.

Second Embodiment

Figure 8:
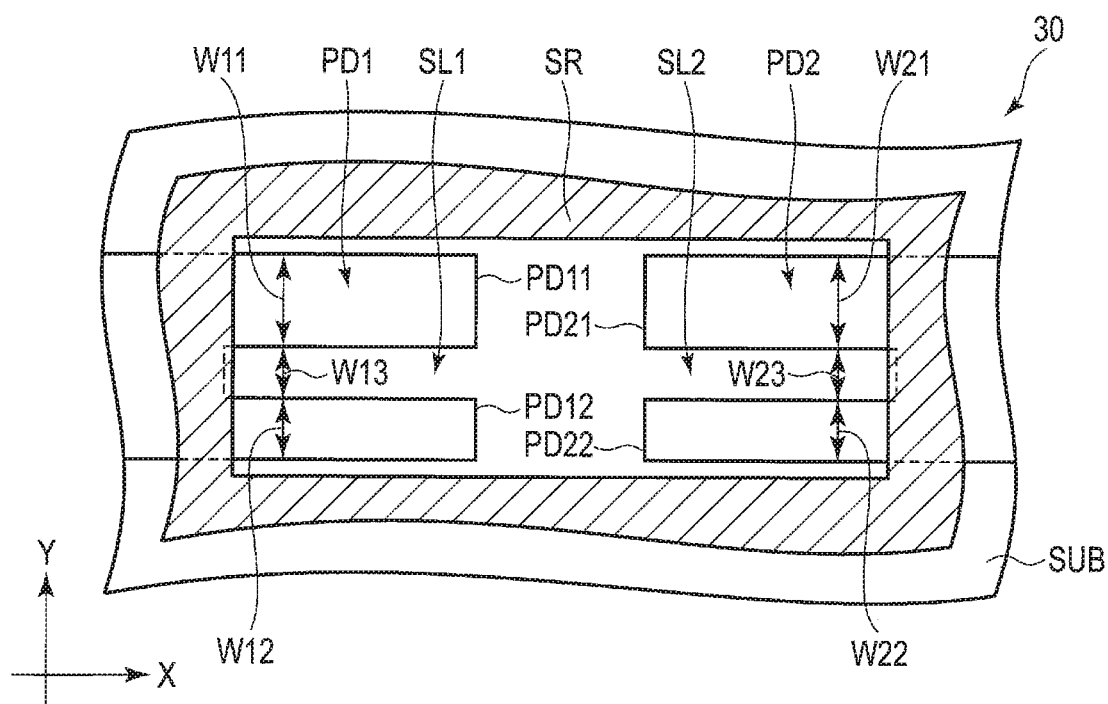
FIG. 8 is a plan view showing a printed circuit board of the second embodiment.

FIG. 8 is a plan view showing a printed circuit board 30 of the second embodiment. The structure shown in FIG. 8 is different from that shown in FIG. 4 mainly in the shapes of the first pad PD1 and the second pad PD2. Further, the first protruding portion 4a and the second protruding portion 4b are not formed in the solder resist SR.

The first pad PD1 comprises a first sit SL1. The second pad PD2 comprises a second slit SL2. The first slit SL1 and the second slit SL2 extend out in the first direction X. The first pad PD1 is divided into a first portion PD11 and a second portion PD12 by the first slit SL1. The second pad PD2 is divided into a third portion PD21 and a fourth portion PD22 by the second slit SL2. The first portion PD11 and the second portion PD12 are connected to each other in a position covered by the solder resist SR. The third portion PD21 and the fourth portion PD22 are connected to each other in a position covered by the solder resist SR.

The first portion PD11 has a width (first width) W11 along the second direction Y, the second portion PD12 has a width (second width) W12 along the second direction Y, and the first slit SL1 has a width W13 along the second direction Y. The width W11 is greater than the width W12. The third portion PD21 has a width W21 along the second direction Y, the fourth portion PD22 has a width W22 along the second direction Y, and the second slit SL2 has a width W23 along the second direction Y. The width W21 is greater than the width. W22. For example, the widths W11 and W21 are about 0.2 mm. The widths W12 and W22 are about 0.1 mm. The widths W13 and W23 are about 0.1 mm.

Figure 9:
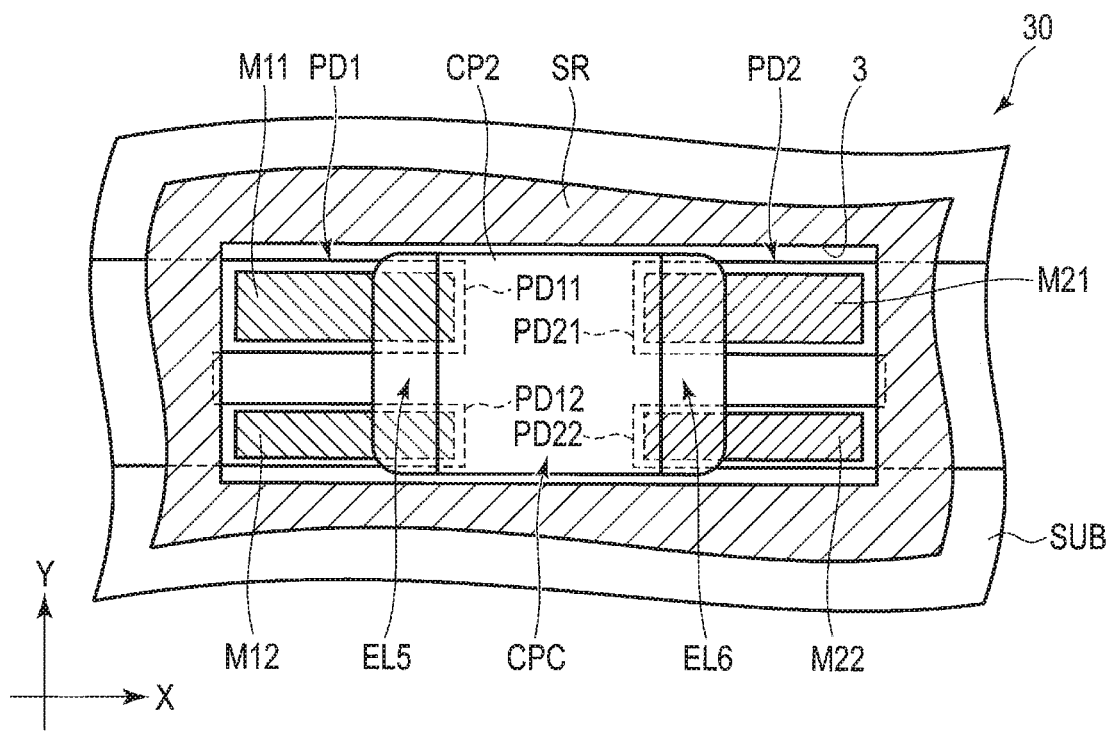
FIG. 9 is a plan view showing a state where a chip part is mounted in a first pad and a second pad shown in FIG. 8.

FIG. 9 is a plan view showing a state where a chip part CP3 is mounted on the first pad PD1 and the second pad PD2 shown in FIG. 8. As compared to the structure shown in FIG. 8, the printed circuit board 30 shown in FIG. 9 further comprises metal layers M11, M12, M21 and M22, and a chip part CP3.

The chip part CP3 comprises a main body CPC, a fifth electrode EL5 located on one end side of the main body CPC and a sixth electrode EL6 located in the other end side of the main body CPC. The chip part CP3 has, for example, a width along the first direction X is about 1.0 mm, and a width along the second direction Y of about 0.5 mm. The metal layer (first metal layer) M11 is located on the first portion PD11. The metal layer (second metal layer) M12 is located on the second portion PD12. The metal layer (third metal layer) M21 is located on the third portion PD21. The metal layer (fourth metal layer) M22 is located on the fourth portion PD22. The fifth electrode EL5 of the chip part CP3 is electrically connected to the first portion PD11 via the metal layer M11 and also electrically connected to the second portion PD12 via the metal layer M12. The sixth electrode EL6 of chip part CP3 is electrically connected to the third portion PD21 via the metal layer M21 and also electrically connected to the fourth portion PD22 via the metal layer M22.

Figure 10:
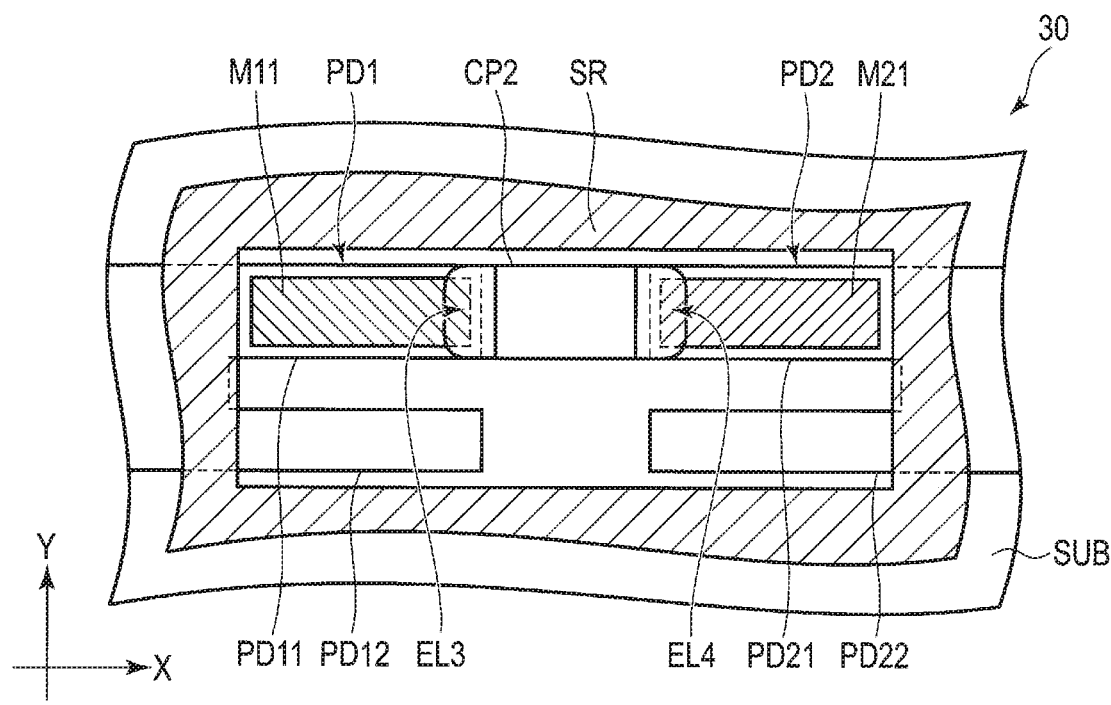
FIG. 10 is a plan view showing a state where a chip part is mounted in the first pad and the second pad shown in FIG. 8.

FIG. 10 is a plan view showing a state where the chip part CP2 is mounted on the first pad PD1 and the second pad PD2 shown in FIG. 8. As compared to the structure shown in FIG. 8, the printed circuit board 30 shown in FIG. 10 further comprises the metal layers M11, M21, and the chip part CP2.

The metal layer M11 is located on the first portion PD11. The metal layer M21 is located on the third portion PD21. The third electrode EL3 is electrically connected to the first portion PD11 via the metal layer M11. The fourth electrode EL4 is electrically connected to the third portion PD21 via the metal layer M21.

Figure 11:
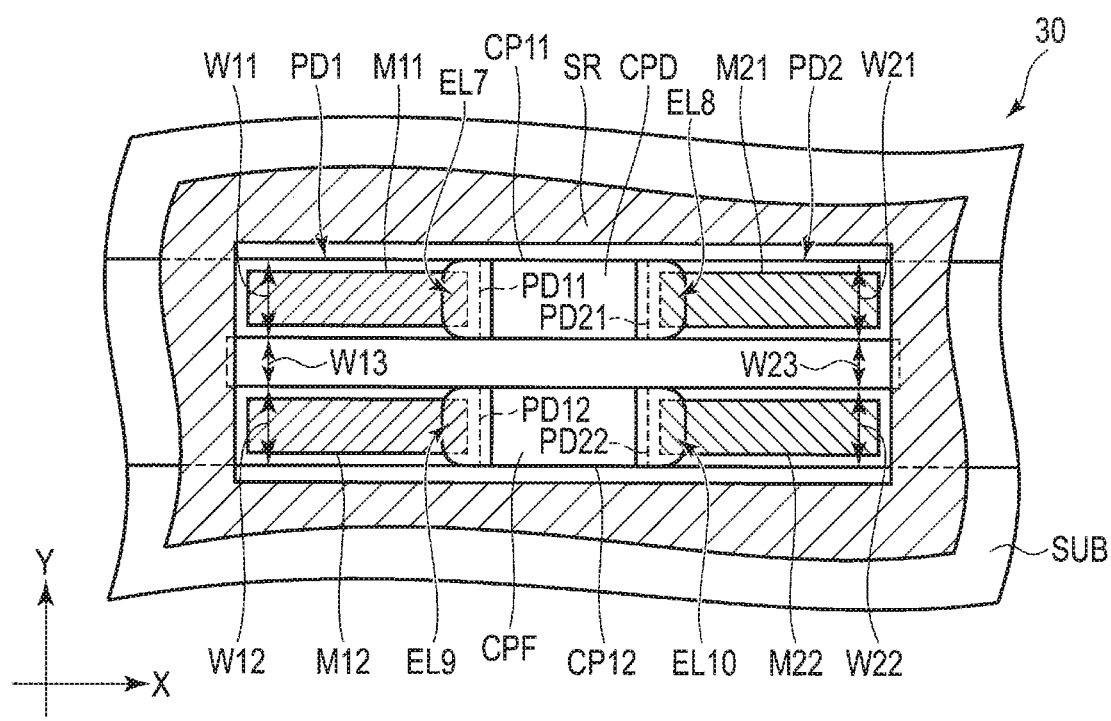
FIG. 11 is a plan view showing a state where a chip is mounted in the first pad and the second pad shown in FIG. 8.

FIG. 11 is a plan view showing a state where chip parts CP11 and CP12 are mounted on first pads PD1 and second pads PD2, respectively, shown in FIG. 8. As compared to the structure shown in FIG. 8, the printed circuit board 30 shown in FIG. 11 further comprises metal layers M11, M12, M21 and M22 and the chip parts CP11 and CP12. The chip part CP11 comprises a main body CPD, a seventh electrode EL7 located on one end side of the main body CPD and an eighth electrode EL8 located on the other end side of the main body CPD. The chip part CP12 comprises a main body CPF, a ninth electrode EL9 located on one end side of the main body CPF and a tenth electrode EL10 located on the other end side of the main body CPF. The chip parts CP11 and CP12 has the same size, that is, for example, a width along the first direction X of about 0.3 mm and a width along the second direction Y of about 0.15 mm. Note that, the chip parts CP11 and CP12 may have, for example, a width along the first direction X of about 0.2 mm and a width along the second direction Y of about 0.1 mm. The seventh electrode EL7 is electrically connected to the first portion PD11 via the metal layer M11. The eighth electrode EL8 is electrically connected to the third portion PD21 via the metal layer M21. The ninth electrode EL9 is electrically connected to the second portion PD12 via the metal layer M12. The tenth electrode EL10 is electrically connected to the fourth portion PD22 via the metal layer M22.

In the example illustrated, the widths W11 and W12 are equal to each other and the widths W21 and W22 are equal to each other. For example, the widths W11, W12, W21 and W22 are about 0.15 mm. The widths W13 and W23 are about 0.1 mm.

According to the second embodiment, the first pad PD1 and the second pad PD2 comprise the first slit SL1 and the second slit SL2, respectively. Here, due to surface tension, molten solder does not flow down into the first slit SL1 and the second slit SL2, the molten solder is stopped before the first slit SL1 and the second slit SL2. Therefore, positioning error of chip parts can be suppressed. Moreover, chip parts of different sizes can be mounted.

Third Embodiment

Figure 12:
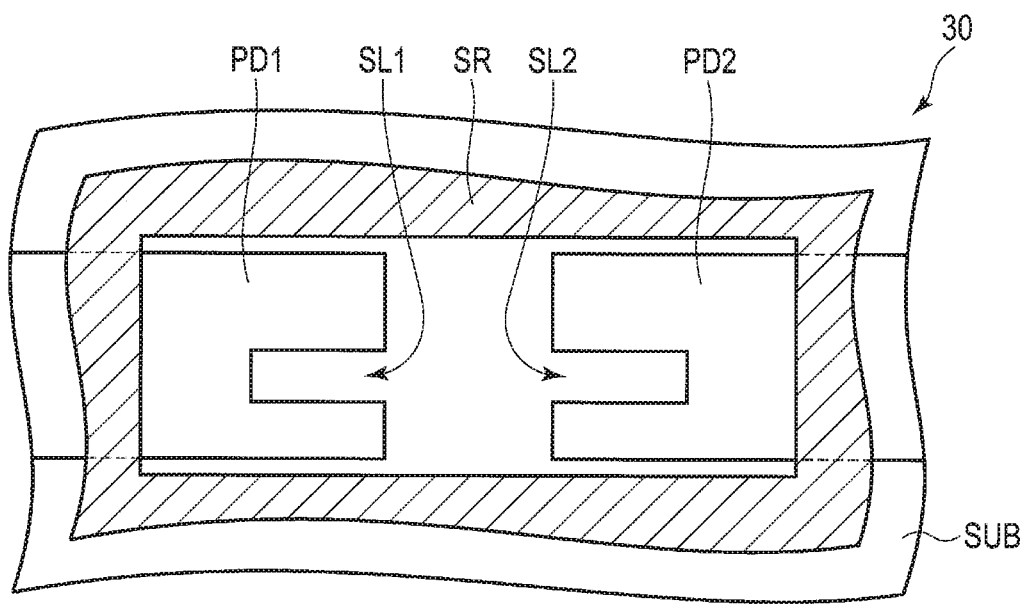
FIG. 12 is a plan view showing a printed circuit board of the third embodiment.

FIG. 12 is a plan view showing a printed circuit board 30 of the third embodiment. The structure shown in FIG. 12 is different from that shown in FIG. 8 in that the first slit SL1 and the second slit SL2 are not extended to the position overlapping the solder resist SR.

For the first pad PD1 and the second pad PD2 of such a structure, chip parts similar to those of FIGS. 9 to 11 can be mounted as well. Accordingly, an advantage similar to that of the second embodiment can be obtained.

Fourth Embodiment

Figure 13:
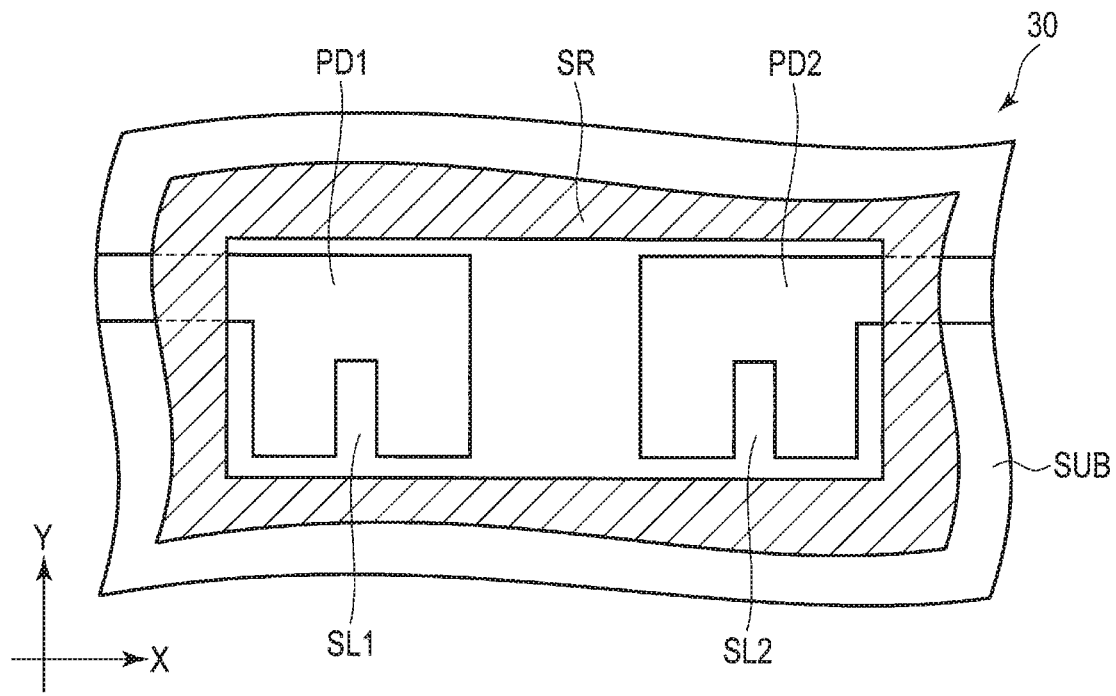
FIG. 13 is a plan view showing a printed circuit board of the fourth embodiment.

FIG. 13 is a plan view showing a printed circuit board 30 of the fourth embodiment. The structure shown in FIG. 13 is different from that shown in FIG. 12 in the extending direction or the first slit SL1 and the second slit SL2.

The first slit SL1 and the second slit SL2 extend in the second direction Y.

Figure 14:
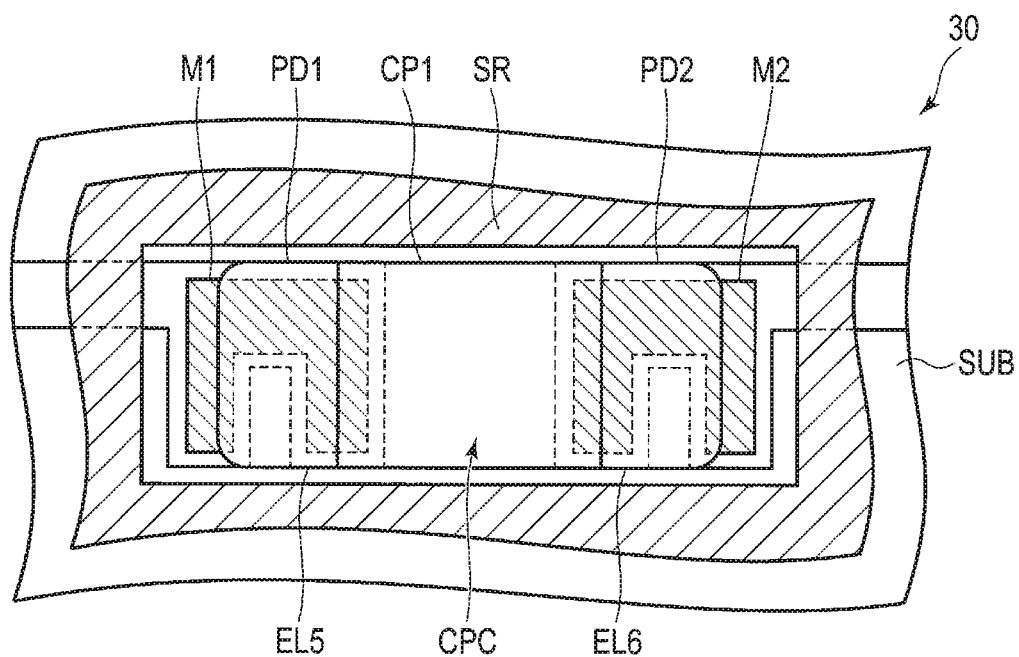
FIG. 14 is a plan view showing the state where a chip part is mounted in a first pad and a second pad shown in FIG. 13.

FIG. 14 is a plan view showing a state where chip part CP3 is mounted on the first pad PD1 and the second pad PD2 shown in FIG. 13. As compared to the structure shown in FIG. 13, the printed circuit board 30 shown in FIG. 14 further comprises metal layers M1, M2, and a chip part CP3.

The metal layer M1 is located on the first pad PD1. The metal layer M2 is located on the second pad PD2. The fifth electrode EL5 is electrically connected to the first pad PD1 via the metal layer M1. The sixth electrode EL6 is electrically connected to the second pad PD2 via the metal layer M2.

Figure 15:
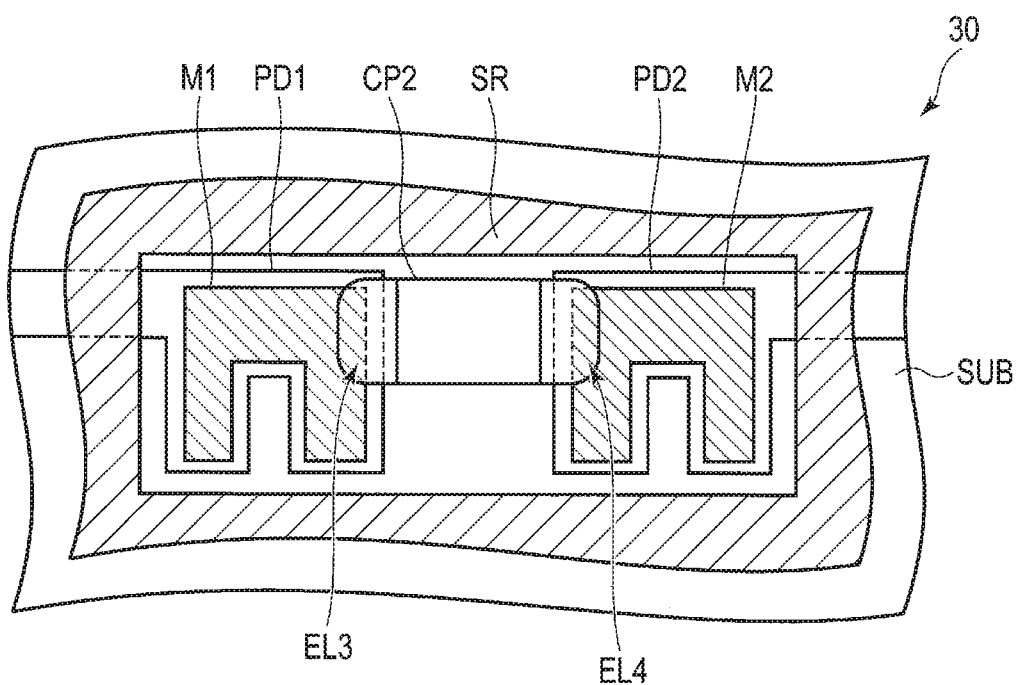
FIG. 15 is a plan view showing the state where a chip part is mounted in the first pad and the second pad shown in FIG. 13.

FIG. 15 is a plan view showing a state where a chip part CP2 is mounted on the first pad PD1 and the second pad PD2 shown in FIG. 13. As compared to the structure shown in FIG. 13, the printed circuit board 30 shown in FIG. 15 further comprises metal layers M1, M2, and a chip part CP2.

The third electrode EL3 is electrically connected to the first pad PD1 via the metal layer M1. The fourth electrode EL4 is electrically connected to the second pad PD2 via the metal layer M2.

With the fourth embodiment, an advantageous effect similar to that of the second embodiment can be obtained.

Fifth Embodiment

Figure 16:
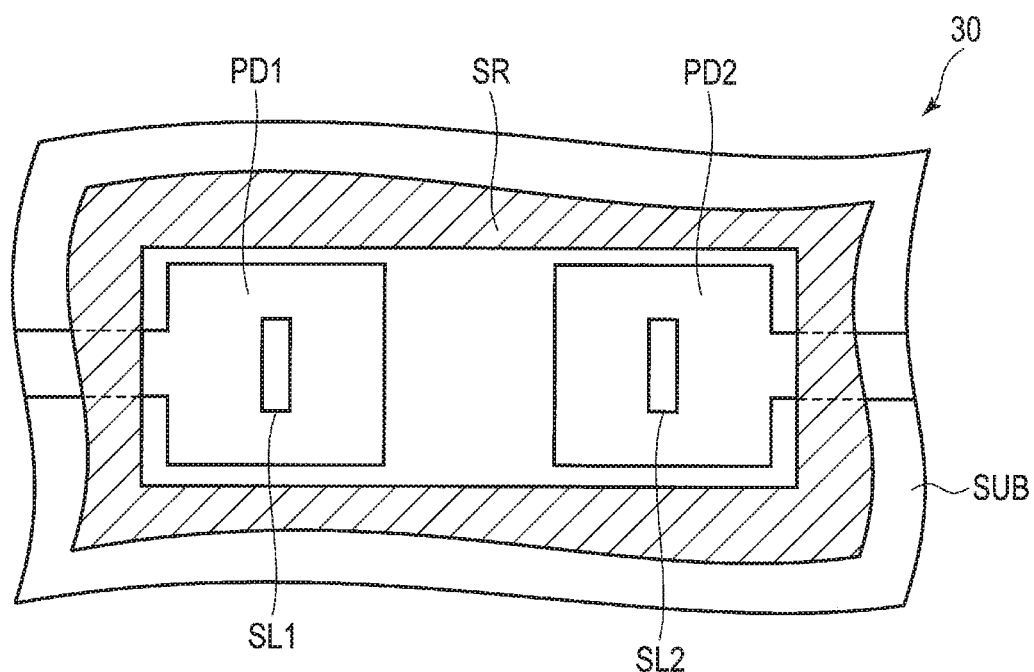
FIG. 16 is a plan view showing a printed circuit board of the fifth embodiment.

FIG. 16 is a plan view showing a printed circuit board 30 of the fifth embodiment.

The structure shown in FIG. 16 is different from that shown in FIG. 13 in the positions of the first slit SL1 and the second slit SL2.

The first slit SL1 is located at substantially the center of the first pad PD1. The second slit SL2 is located at substantially the center of the second pad PD2. That is, the first slit SL1 and the second slit SL2 are not extended to the ends of the first pad PD1 and the second pad PD2, respectively.

With the fifth embodiment, an advantageous effect similar to that of the second embodiment can be obtained.

Sixth Embodiment

Figure 17:
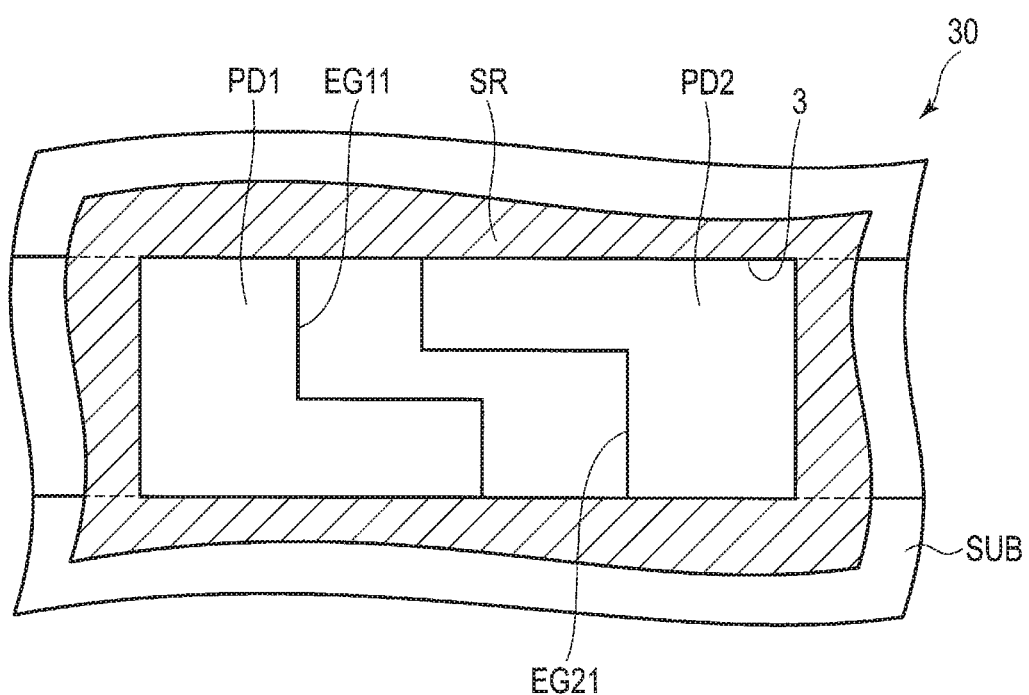
FIG. 17 is a plan view showing a printed circuit board of the sixth embodiment.

FIG. 17 is a plan view showing a printed circuit board 30 of the sixth embodiment. The structure shown in FIG. 17 is different from that shown in FIG. 8 in the shape of the first pad PD1 and the second pad PD2.

The first pad PD1 includes an edge portion EG11 opposing the second pad PD2. The second pad PD2 includes an edge portion EG21 opposing the first pad PD1. The edge portions EG11 and EG21 are curved so as to be parallel to each other.

Figure 18:
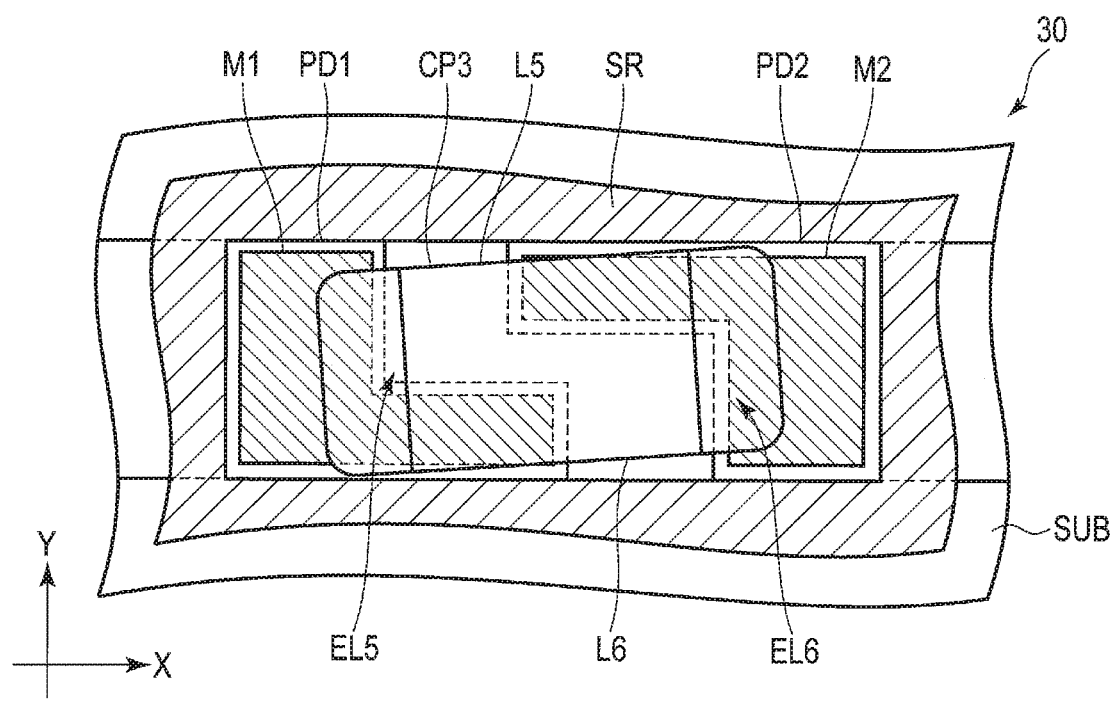
FIG. 18 is a plan view showing a state where a chip part is mounted in a first pad and a second pad shown in FIG. 17.

FIG. 18 is a plan view showing a state where a chip part CP3 is mounted on the first pad PD1 and the second pad PD2 shown in FIG. 17. As compared with the structure shown in FIG. 17, The printed circuit board 30 shown in FIG. 18 further comprises metal layers M1, M2, and a chip part CP3.

The metal layer M1 is located on the first pad PD1. The metal layer M2 is located on the second pad PD2. The fifth electrode EL5 is electrically connected to the first pad PD1 via the metal layer M1. The sixth electrode EL6 is electrically connected to the second pad PD2 via the metal layer M2. The chip part CP3 includes a fifth long side L5 and a sixth long side L6. The fifth long side L5 and the sixth long side L6 are inclined with respect to the first direction X.

Figure 19:
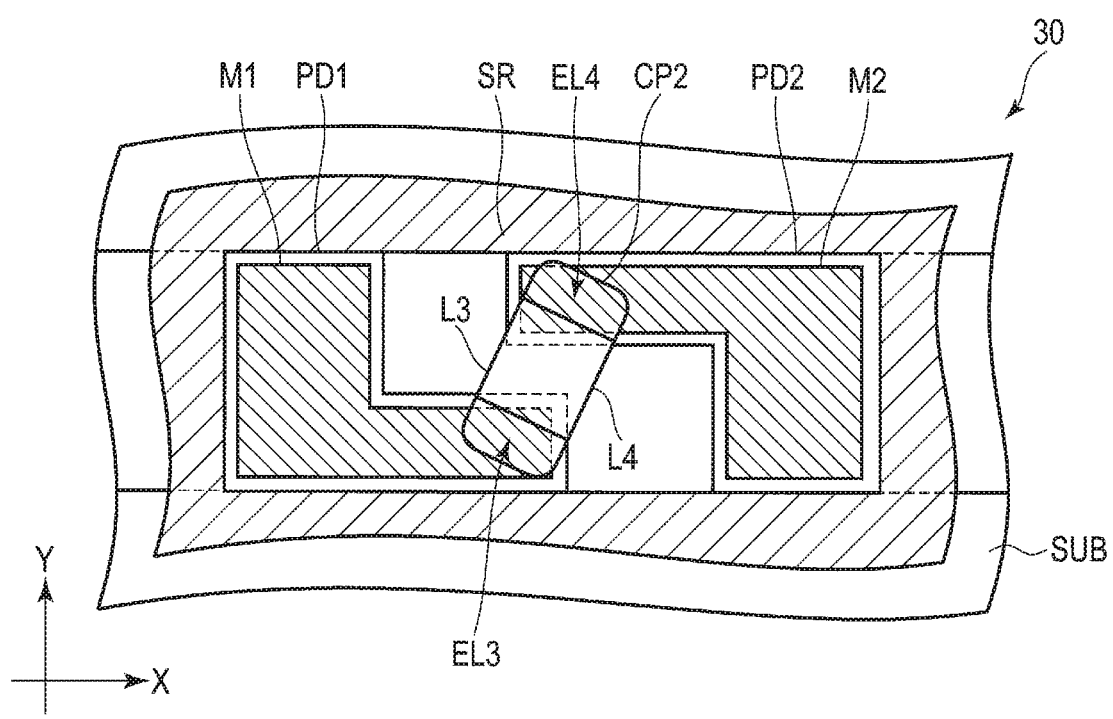
FIG. 19 is a plan view showing the state where a chip part is mounted in the first pad and the second pad shown in FIG. 17.

FIG. 19 is a plan view showing a state where a chip part CP2 is mounted on the first pad PD1 and the second pad PD2 shown in FIG. 17. As compared to the structure shown in FIG. 17, the printed circuit board 30 shown in FIG. 19 further comprises metal layers M1, M2, and a chip part CP2.

The third electrode EL3 is electrically connected to the first pad PD1 via the metal layer M1. The fourth electrode EL4 is electrically connected to the second pad PD2 via the metal layer M2. The third long side L3 and the fourth long side L4 of the chip part CP2 are inclined with respect to the first direction X.

In the first pad PD1 and the second pad PD2 shown in the sixth embodiment as well, chip parts of a plurality of sizes can be mounted. Moreover, due to the shape of the first pad PD1 and the second pad PD2 illustrated in the sixth embodiment, chip parts can be moved by rotation, and therefore the chip parts can be guided to the positions where solder wettability is stabilized.

Seventh Embodiment

Figure 20:
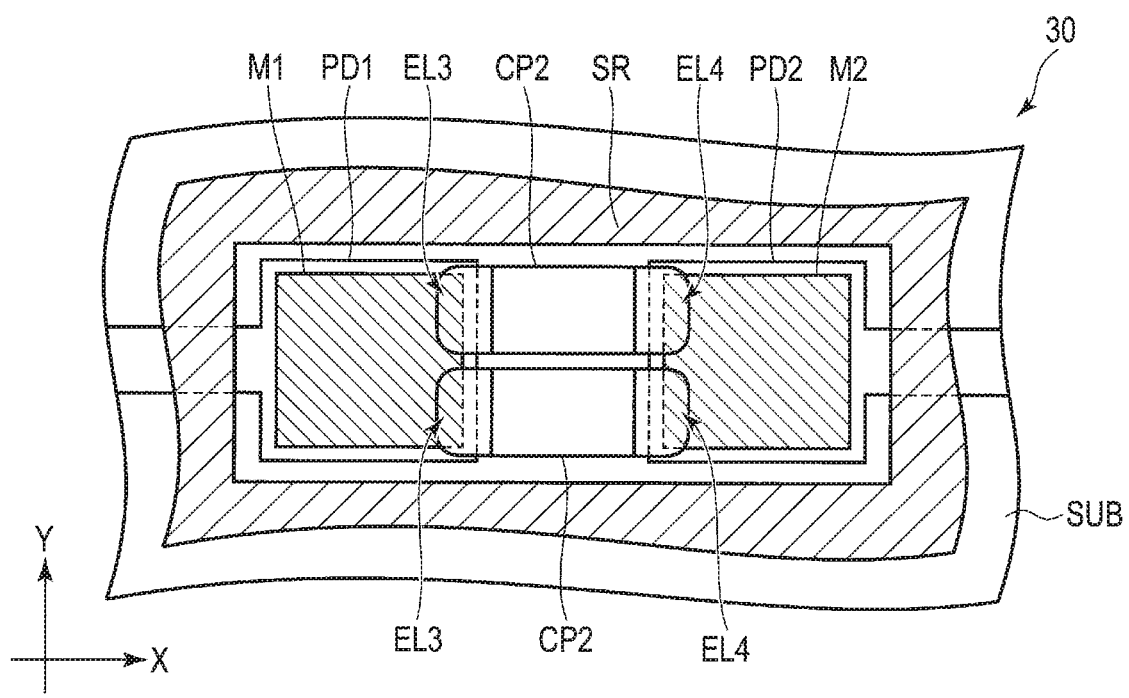
FIG. 20 is a plan view showing a printed circuit board of the seventh embodiment.

FIG. 20 is a plan view showing a printed circuit board 30 of the seventh embodiment.

The structure shown in FIG. 20 is different from that shown in FIG. 4 in that the first protruding portion 4a and the second protruding portion 4b are not formed in the solder resist SR, and that comprises metal layers M1, M2, and two chip parts CP2.

The two chip parts CP2 are arranged along the second direction Y. The third electrode EL3 of each part is electrically connected to the first pad PD1 via the metal layer M1. The fourth electrode EL4 of each part is electrically connected to the second pad PD2 via the metal layer M2.

As described above, according to this embodiment, such a printed circuit board can be obtained, which comprises pads on which chip parts of different sizes can be mounted.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fail within the scope and spirit of the inventions.

What is claimed is:

1. A printed circuit board comprising:
 a base substrate;
 a first pad located on the base substrate and a first metal layer located on the first pad;
 a second pad located on the base substrate alongside the first pad with respect to a first direction with a gap therebetween and a second metal layer located on the second pad; and a solder resist covering the base substrate and comprising a cavity portion in a position overlapping the first pad, the second pad, and the gap between the first pad and the second pad, a first chip electrically connected to the first pad and the second pad and located overlapping the gap, wherein the first chip includes a first electrode electrically connected to the first pad via the first metal layer and a second electrode electrically connected to the second pad via the second metal layer;

wherein the solder resist includes a first protruding portion projecting in a second direction crossing the first direction and a second protruding portion projecting in the second direction on an opposite side to the first protruding portion, the first protruding portion and the second protruding portion each overlap the gap between the first pad and the second pad, an end of the first pad on a gap side, and an end of the second pad on a gap side, and at least a part of the first chip is located between the first protruding portion and the second protruding portion in plan view.

2. The printed circuit board of claim 1, wherein the first protruding portion comprises a first edge extending in the first direction, a second edge extending from an end of the first edge along the first direction through the end of the first pad to over the first pad and inclined with respect to the first direction, and a third edge extending from another end of the first edge along the first direction through the end of the second pad to over the second pad and inclined with respect to the first direction, and the second protruding portion comprises a fourth edge extending in the first direction and opposing the first edge with a gap therebetween, a fifth edge extending from an end of the fourth edge along the first direction through the end of the first pad to over the first pad and inclined with respect to the first direction, and a sixth edge extending from another end of the fourth edge along the first direction through the end of the second pad to over the second pad and inclined with respect to the first direction.

3. A disk device comprising:
a disk-shaped recording medium including a recording layer; and a printed circuit board of claim 1.

4. The printed circuit board of claim 1, wherein the first chip is a capacitor.

5. The printed circuit board of claim 1, wherein the first chip is located above the gap in a third direction perpendicular to the first direction and the second direction.

6. The printed circuit board of claim 1, wherein the solder resist is surrounding the cavity, the first pad and the second pad in the cavity.

7. The printed circuit board of claim 1, wherein the first protruding portion partly overlaps the first pad and the second pad.

8. The printed circuit board of claim 2,
wherein the first chip comprises a first long side intersecting the second edge and the third edge, and a second long side intersecting the fifth edge and the sixth edge.

9. The printed circuit board of claim 2,
wherein the first second chip comprises a first long side overlapping the first edge, and a second long side overlapping the fourth edge.

10. The printed circuit board of claim 7, wherein the second protruding portion partly overlaps the first pad and the second pad.

* * * * *